United States Patent
Inoue

(10) Patent No.: US 6,968,938 B2
(45) Date of Patent: Nov. 29, 2005

(54) CONVEY DEVICE FOR A PLATE-LIKE WORKPIECE

(75) Inventor: Takaaki Inoue, Tokyo (JP)

(73) Assignee: Disco Corporation, Tokyo (JP)

( * ) Notice: Subject to any disclaimer, the term of this patent is extended or adjusted under 35 U.S.C. 154(b) by 125 days.

(21) Appl. No.: 10/752,528

(22) Filed: Jan. 8, 2004

(65) Prior Publication Data

US 2004/0140176 A1 Jul. 22, 2004

(30) Foreign Application Priority Data

Jan. 9, 2003 (JP) .............................. 2003-002958

(51) Int. Cl.$^7$ ............................................ B65G 47/00
(52) U.S. Cl. ................ 198/468.4; 414/737; 414/744.8; 294/64.1; 269/21
(58) Field of Search .......................... 198/468.4, 471.1, 198/689.1; 414/941, 737, 744.8, 752.1; 901/40; 294/64.1, 64.3; 269/21

(56) References Cited

U.S. PATENT DOCUMENTS

| | | | |
|---|---|---|---|
| 3,539,216 A * | 11/1970 | Forcier ..................... | 294/64.3 |
| 4,009,785 A * | 3/1977 | Trayes ..................... | 414/752.1 |
| 4,087,133 A | 5/1978 | Olofsen et al. | |
| 5,067,762 A * | 11/1991 | Akashi ..................... | 294/64.3 |
| 5,080,549 A | 1/1992 | Goodwin et al. | |
| 5,324,155 A | 6/1994 | Goodwin et al. | |
| 5,671,910 A * | 9/1997 | Davies et al. ................. | 269/21 |
| 5,738,165 A * | 4/1998 | Imai ............................ | 269/21 |
| 5,972,153 A * | 10/1999 | Focke et al. ................. | 156/256 |
| 6,155,773 A | 12/2000 | Ebbing et al. | |
| 6,341,769 B1 * | 1/2002 | Lin et al. .................... | 294/64.1 |
| 6,500,047 B2 * | 12/2002 | Arai et al. .................... | 451/14 |
| 6,692,219 B2 * | 2/2004 | Coomer et al. ............. | 414/754 |

FOREIGN PATENT DOCUMENTS

JP 5-36816 2/1993

* cited by examiner

Primary Examiner—James R. Bidwell
(74) Attorney, Agent, or Firm—Smith, Gambrell & Russell, LLP

(57) ABSTRACT

A conveying device for a plate-like workpiece, comprising a suction-holding device for suction-holding the plate-like workpiece and a moving device for moving the suction-holding device between a first predetermined position and a second predetermined position, wherein the suction-holding device comprises a plate-like workpiece holding member, non-contact suction-holders disposed on the under surface of the center area of the plate-like workpiece holding member, a restricting device which is mounted on the under surface of the peripheral area of the plate-like workpiece holding member and restricts the movement in the horizontal direction of the plate-like workpiece, and a plurality of falling prevention devices which are mounted in the peripheral area of the plate-like workpiece holding member at predetermined intervals in the circumferential direction and prevent the falling of the plate-like workpiece adsorbed by the non-contact suction-holders.

6 Claims, 6 Drawing Sheets

CONVEY DEVICE FOR A PLATE-LIKE WORKPIECE

FIELD OF THE INVENTION

The present invention relates to a conveying device for carrying a plate-like workpiece such as a semiconductor wafer or the like.

DESCRIPTION OF THE PRIOR ART

In the production process of a semiconductor device, a circuit such as IC or LSI is formed in a large number of areas arranged in a lattice form on the front surface of a substantially disk-like semiconductor wafer, and the areas in which the circuit has been formed are diced along predetermined cutting lines called "streets" to produce individual semiconductor chips. The thus divided semiconductor chips are packaged and widely used in electric appliances such as cellular telephones and personal computers. For the purpose of improving the heat dissipation of a semiconductor chip, the semiconductor chip is desirably formed as thin as possible. Also, to enable the downsizing of a cellular telephone, smart card or personal computer that uses a large number of semiconductor devices, the thickness of the semiconductor device is desirably as small as possible.

As technology for reducing the thickness of a semiconductor chip, a so-called "dicing method" is widely employed in which after grooves having a predetermined depth (corresponding to the final thickness of the semiconductor chip) from the surface are formed beforehand along the streets by a cutting machine before the back surface of the semiconductor wafer is ground, the back surface of the semiconductor wafer is ground by a grinding machine to expose the grooves in order to divide the semiconductor wafer into individual semiconductor chips.

However, when the grooves are formed in the front surface of the semiconductor wafer, the semiconductor wafer having the grooves is liable to break and crack during conveyance. To solve these problems, in the cutting machine for forming the grooves on the front surface of the semiconductor wafer, a Bernoulli theorem type non-contact suction pad is used as a suction-holding means for a conveying device for carrying a semiconductor wafer having grooves. This type of conveying device is disclosed by JP-A 5-36816, for example.

The Bernoulli theorem type non-contact suction pad is so constituted that a negative pressure is produced by letting air out along the inner surface of a suction plate to suction-hold a semiconductor wafer owing to this negative pressure. Therefore, it has a problem that when an air supply source goes wrong and air supply is stopped during the conveyance, the above negative pressure cannot be produced with the result that a semiconductor wafer falls.

SUMMARY OF THE INVENTION

It is an object of the present invention to provide a conveying device for carrying a plate-like workpiece, comprising Bernoulli theorem type non-contact suction-holders, which is capable of preventing the falling of the plate-like workpiece to be carried even when air supply to the non-contact suction-holders is suspended.

To attain the above object, according to the present invention, there is provided a conveying device for a plate-like workpiece, comprising a suction-holding means for suction-holding the plate-like workpiece, and a moving means for moving this suction-holding means between a first predetermined position and a second predetermined position, wherein:

the suction-holding means comprises a plate-like workpiece holding member, non-contact suction-holders disposed on the under surface of the center area of the plate-like workpiece holding member, a restricting means which is mounted on the under surface of the peripheral area of the plate-like workpiece holding member and restricts the movement in the horizontal direction of the plate-like workpiece, and a plurality of falling prevention means which are mounted in the peripheral area of the plate-like workpiece holding member at predetermined intervals in the circumferential direction and prevent the falling of the plate-like workpiece adsorbed by the non-contact suction-holders.

Each of the falling prevention means comprises a support member that can be moved to a holding position for supporting the under surface of the peripheral portion of the plate-like workpiece adsorbed by the non-contact suction-holders and to a retreat position where it retreats from the holding position outward in the radial direction of the plate-like workpiece holding member, and an air piston mechanism for operating the support member to the holding position and to the retreat position. This air piston mechanism has a spring for urging the above support member toward the holding position. When air is supplied, the support member is situated to the retreat position in defiance of the spring force of the spring and when air supply is cut off, the support member is situated to the holding position by the spring force of the spring.

Air to be supplied to the above air piston mechanism is supplied by an air supply means having an air supply source for supplying air to the above non-contact suction-holders. This air supply means comprises an electromagnetic control valve mounted to a pipe for connecting the air tank of the air supply source and the air piston mechanism, a pressure detection means for detecting the inside air pressure of the air tank, and a control means for controlling the electromagnetic control valve in response to a detection signal from the pressure detection means. The control means controls the electromagnetic control valve to disconnect the air piston mechanism from the air tank and release the air of the air piston mechanism when the inside air pressure of the air tank becomes a predetermined value or less.

Preferably, the above falling prevention means is so constituted to be allowed to move for adjustment in the radial direction of the above plate-like workpiece holding member.

DETAILED DESCRIPTION OF THE PREFERRED EMBODIMENTS

A conveying device for a plate-like workpiece according to a preferred embodiment of the present invention will be described in detail with reference to the accompanying drawings.

Figure 1:
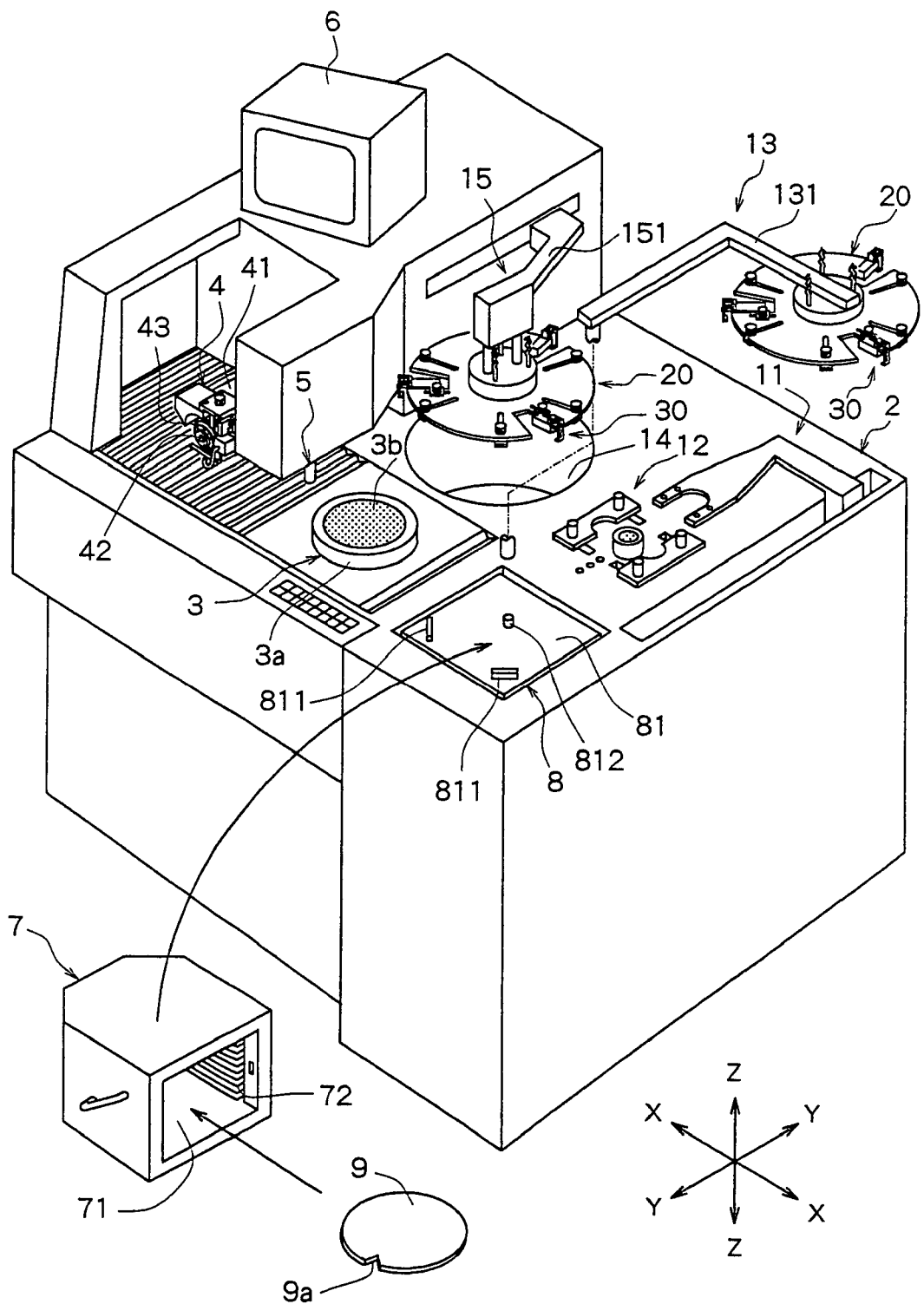
FIG. 1 is a perspective view of a cutting machine as a dicing machine provided with conveying devices for a plate-like workpiece, constituted according to the present invention.

FIG. 1 is a perspective view of a cutting machine as a dicing machine equipped with conveying devices for a plate-like workpiece, constituted according to the present invention.

The cutting machine in the illustrated embodiment has a substantially rectangular parallelepiped housing 2. In the housing 2, there is installed a chuck table 3 for holding a workpiece in such a manner that it can move in a direction shown by an arrow X that is a feed direction. The chuck table 3 comprises an adsorption chuck support base 3a and an adsorption chuck 3b which is mounted on the adsorption chuck support base 3a and is connected to a negative pressure control means that is not shown. Therefore, when, for example, a disk-like semiconductor wafer that is a workpiece is placed on the placing surface that is the top surface of the adsorption chuck 3b, and a negative pressure is applied to the adsorption chuck 3b by the negative pressure control means (not shown), the semiconductor wafer is suction-held on the adsorption chuck 3b. The chuck table 3 is constituted in such a manner that it can be turned by a rotation means that is not shown.

The cutting machine in the illustrated embodiment has a spindle unit 4 as a cutting means. The spindle unit 4 comprises a spindle housing 41 which is mounted to a movable base (not shown) to be moved for adjustment in a direction shown by an arrow Y that is an indexing direction and a direction shown by an arrow Z that is a cutting direction, a rotary spindle 42 which is rotatably supported to the spindle housing 41 and rotatably driven by a rotation-drive means (not shown), and a cutting blade 43 attached to the rotary spindle 42.

The cutting machine in the illustrated embodiment has an image pick-up means 5 for picking up an image of the front surface of the semiconductor wafer held on the top surface of the adsorption chuck 3b, detecting an area to be cut with the above cutting blade 43 and confirming the state of the grooves. The image pick-up means 5 is composed of an optical means such as a microscope or CCD camera. The dicing machine has display means 6 for displaying an image picked up by the image pick-up means 5.

The cutting machine in the illustrated embodiment comprises a cassette placing means 8 that is arranged in a cassette placing area and places a cassette 7 storing semiconductor wafers as workpieces. A description is subsequently given of the cassette 7 to be placed on the cassette placing means 8. The cassette 7 in the illustrated embodiment has a take-out/take-in opening 71 for taking the semiconductor wafer in and out in one side portion, and a plurality of racks 72 for placing the semiconductor wafer 9 are arranged, in a vertical direction, in the inside of the cassette 7. The cassette placing means 8 for placing this cassette 7 comprises a cassette table 81 for mounting the cassette 7 and a lifting means (not shown) for vertically moving the cassette table 81 up and down. The cassette table 81 is provided with a positioning member 811 for positioning the cassette table 81 on the top surface when the above cassette 7 is placed thereon, and also with a cassette sensor 812 for detecting whether the cassette is placed.

The illustrated cutting machine has a workpiece take-out means 11 for taking out a semiconductor wafer 9 as a workpiece that is stored in the cassette 7 placed on the cassette table 81 of the cassette placing means 8. This workpiece take-out means 11 carries the semiconductor wafer 9 stored in the cassette 7 to an aligning means 12 provided in a tentatively placing area by advancing or retreating the cassette 7 placed on the cassette placing means 8.

The cutting machine in the illustrated embodiment comprises a first conveying device 13 for carrying the semiconductor wafer 9 conveyed to the aligning means 12, to the top of the above chuck table 3, a cleaning means 14 for cleaning the semiconductor wafer 9 which has been cut on the chuck table 3, and a second conveying device 15 for carrying the semiconductor wafer 9 cut on the chuck table 3, to the cleaning means 14. The first conveying device 13 also functions as a conveying device for carrying the semiconductor wafer 9 cleaned by the cleaning means 14, to the above aligning means 12.

A description is subsequently given of the above first conveying device 13 with reference to FIGS. 2 to 6.

The first conveying device 13 has an L-shaped working arm 131. This L-shaped working arm 131 has, a tone end thereof, connected to a lifting means 132. The lifting means 132 is composed of an air piston, for example, and operates the working arm 131 upward or downward as shown by an arrow 130a. The lifting means 132 connected to one end of the working arm 131 is connected to a moving means 133 including an electric motor which can rotate in a normal or reverse direction. Therefore, by driving the moving means 133 in the normal direction or reverse direction, the working arm 131 is caused to pivot in a direction shown by an arrow 130b in FIG. 2 on the lifting means 132 as the center. As a result, the working arm 131 is operated on the horizontal plane, and a suction-holding means 20, that will be described later and is connected to the other end of the working arm 131 via a mounting member 135, is moved on the horizontal plane between the above aligning means 12 and the above chuck table 3 and between the aligning means 12 and the above cleaning means 14.

Figure 2:
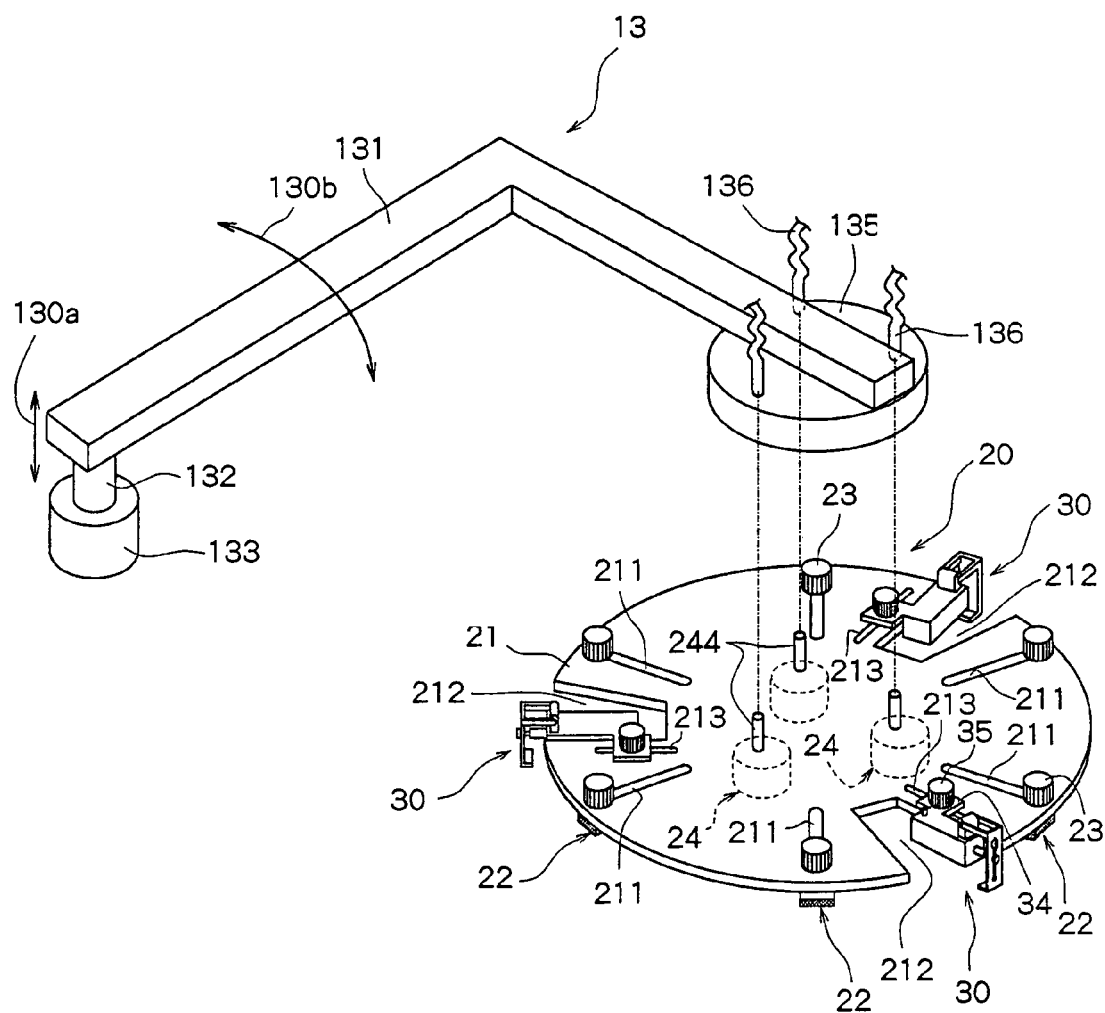
FIG. 2 is an exploded perspective view of a suction-holding means of a first conveying device as a conveying device means constituted according to the present invention.
Figure 3:
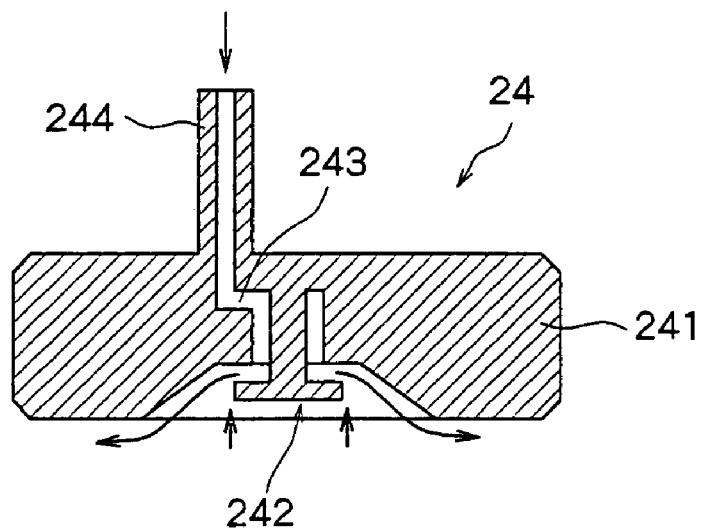
FIG. 3 is a sectional view of a non-contact suction-holder constituting the suction-holding means shown in FIG. 2.

The suction-holding means 20 mounted to the other end of the above working arm 131 via the mounting member 135 has a plate-like workpiece holding member 21 of a disk-like shape as shown in FIG. 2. Three non-contact suction-holders 24 is provided on the under surface of the center area of the plate-like workpiece holding member 21. Each of the non-contact suction-holders 24 comprises a disk-like body 241, a nozzle 242 for ejecting air along the under surface at the center of the body 241, and an air supply passage 243 that is formed in the body 241 and communicates with the nozzle 242, as shown in FIG. 3. A connection portion 244 which communicates with the air supply passage 243 projects from the top surface of the body 241 constituting the non-contact suction-holder 24. A negative pressure is produced in the center portion of this non-contact suction-holder 24 when air is ejected from the nozzle 242 through the air supply passage 243 along the under surface of the body 241. The plate-like workpiece is attracted by this negative pressure. When the plate-like workpiece approaches the non-contact suction-holder 24, air flowing between the under surface of the body 241 and the plate-like workpiece works as repulsive force to prevent contact between them. Thus, the plate-like workpiece is suction-held without contact. The thus constituted non-contact suction-holders 24 are mounted to the under surface of the center area of the plate-like workpiece holding member 21, and the connection portions 244 are inserted and fitted in holes (not shown) provided in the plate-like workpiece holding member 21. The connection portions 244 are further inserted and fitted also in holes (not shown) provided in the above mounting member 135 are connected to respective flexible pipes 136 communicating with an air supply means that will be described later. The number of the non-contact suction-holders 24 is desirably at least 3 to suction-hold the center area of the plate-like workpiece widely and stably.

Figure 4:
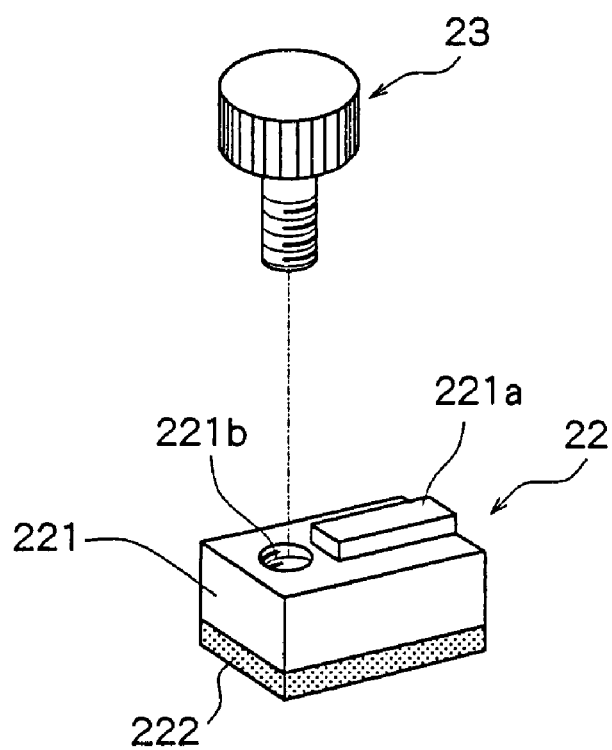
FIG. 4 is a perspective view of a periphery support member and an adjustment screw constituting the suction-holding means shown in FIG. 2.

A plurality of holes 211 prolonged in a radial direction are formed radially in the peripheral portion of the above plate-like workpiece holding member 21 at equal intervals in a circumferential direction. To the respective prolonged holes are fitted periphery support members 22 which are provided on the under surface of the peripheral area of the plate-like workpiece holding member 21 and function as a restricting means for restricting the movement of the plate-like workpiece in the horizontal direction by coming in contact with the top surface of the periphery of the plate-like workpiece such as a semiconductor wafer. Each of the periphery supporting members 22 comprises a rectangular parallel piped moving block 221 and a rubber sheet 222 mounted to the under surface of the moving block 221 as shown in FIG. 4. The moving block 221 has, on the top surface, a guide projection 221a to be fitted to the above prolonged hole 211 and a screw hole 221b. The thus constituted periphery supporting member 22 is mounted to the plate-like workpiece holding member 21 by fitting the guide projection 221a to the prolonged hole 221 from the under surface of the plate-like workpiece holding member 21 and screwing a bolt 23 into the screw hole 221b through the prolonged hole 211 from the top surface of the plate-like workpiece holding member 21. Before the bolt 23 is fastened, the periphery support member 22 is moved along the prolonged hole 211 and positioned at a predetermined location corresponding to the outer size of the plate-like workpiece such as a semiconductor wafer and then, the bolt 23 is fastened. Therefore, the prolonged hole 211 formed in the plate-like workpiece holding member 21 and the bolt 23 function as an adjusting means for adjusting the movement of the periphery support member 22 in the radial direction of the plate-like workpiece holding member 21. Since the periphery supporting members 22 is so constituted to be moved in the radial direction of the plate-like workpiece holding member 21, they can be adjusted to correspond to the size of the plate-like workpiece such as a semiconductor wafer to be carried. The number of the above periphery supporting members 22 is desirably at least 3 to support the periphery of the plate-like workpiece stably.

The suction-holding means 20 shown in FIG. 2 has a plurality of (3 in the illustrated embodiment) falling prevention means 30 which are arranged in the peripheral area of the plate-like workpiece holding member 21 at predetermined intervals in the circumferential direction. The falling prevention means 30 are mounted such that they can move in the radial direction along three cutouts 212 formed in the radial direction in the peripheral portion of the plate-like workpiece holding member 21 at equal intervals in the circumferential direction.

Figure 5:
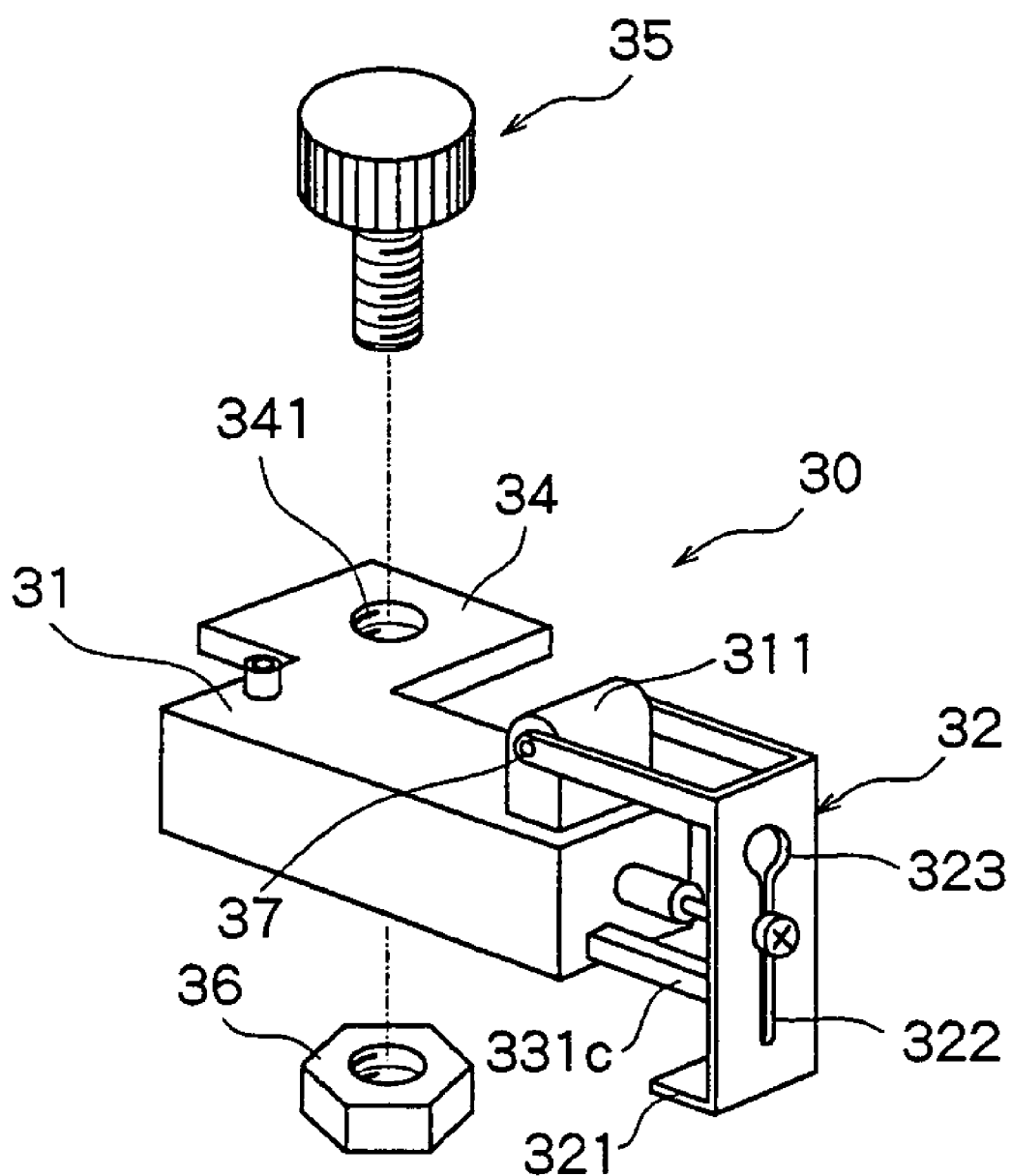
FIG. 5 is a perspective view of a falling prevention means constituting the suction-holding means shown in FIG. 2.

The falling prevention means 30 will be described with reference to FIG. 5 and FIG. 6. The falling prevention means 30 shown in FIG. 5 and FIG. 6 comprises a housing 31, a support member 32 that is pivotably supported, at its one end, to the housing 31, and an air piston mechanism 33 for moving the support member 32 to a holding position shown by a solid line and to a retreat position shown by a two-dot chain line in FIG. 6. A mounting member 34 projects sideways from the top portion of the housing 31 as shown in FIG. 5, and a bolt insertion hole 341 is formed in this mounting member 34. The housing 31 having thus the mounting member 34 is arranged along the cutout 212 formed in the plate-like workpiece holding member 21 to place the mounting member 34 on the top surface of the plate-like workpiece holding member 21. By inserting an adjusting bolt 35 into the bolt insertion hole 341 formed in the mounting member 34 and into a prolonged hole 213 formed parallel to the above cutout 212 formed in the plate-like workpiece holding member 21 and screwing it with a nut 36 arranged on the under side of the plate-like workpiece holding member 21, the housing 31 is mounted to the plate-like workpiece holding member 21. Before the bolt 35 is fastened, the housing 31 is moved along the prolonged hole 213 and positioned at a predetermined location corresponding to the above periphery supporting member 22 and then, bolt 35 is fastened. Therefore, the prolonged hole 213 formed in the plate-like workpiece holding member 21, the bolt 35 and the nut 36 function as adjusting means for moving the housing 31, that is, the falling prevention means 30 in the radial direction of the plate-like workpiece holding member 21.

A description is subsequently given of the above support member 32. The support member 32 has a supporting claw 321 at the lower end, and its upper end is pivotably supported to an attachment portion 311 provided on the above housing 31 by a support shaft 37. A prolonged hole 322 prolonged in a vertical direction is formed in the intermediate portion of the support member 32 and a round insertion hole 323 is formed at the upper end of the prolonged hole 322.

The above air piston mechanism 33 will be described with reference to FIG. 6.

The air piston mechanism 33 has a cylinder hole 331 formed in the above housing 31, a piston 332 which is slidably installed in the cylinder hole 331, and a piston rod 333 connected, at its one end, to the piston 332, and the other end of the piston rod 333 is engaged with the prolonged hole 322 formed in the above support member 32. That is, at the other end of the piston rod 333, there are provided a first engagement portion 333a and a second engagement portion 333b with a larger interval therebetween than the thickness of the above support member 32, and the piston rod 333 between the first engagement portion 333a and the second engagement portion 333b is engaged with the above prolonged hole 322 of the support member 32 with a play therebetween.

Figure 6:
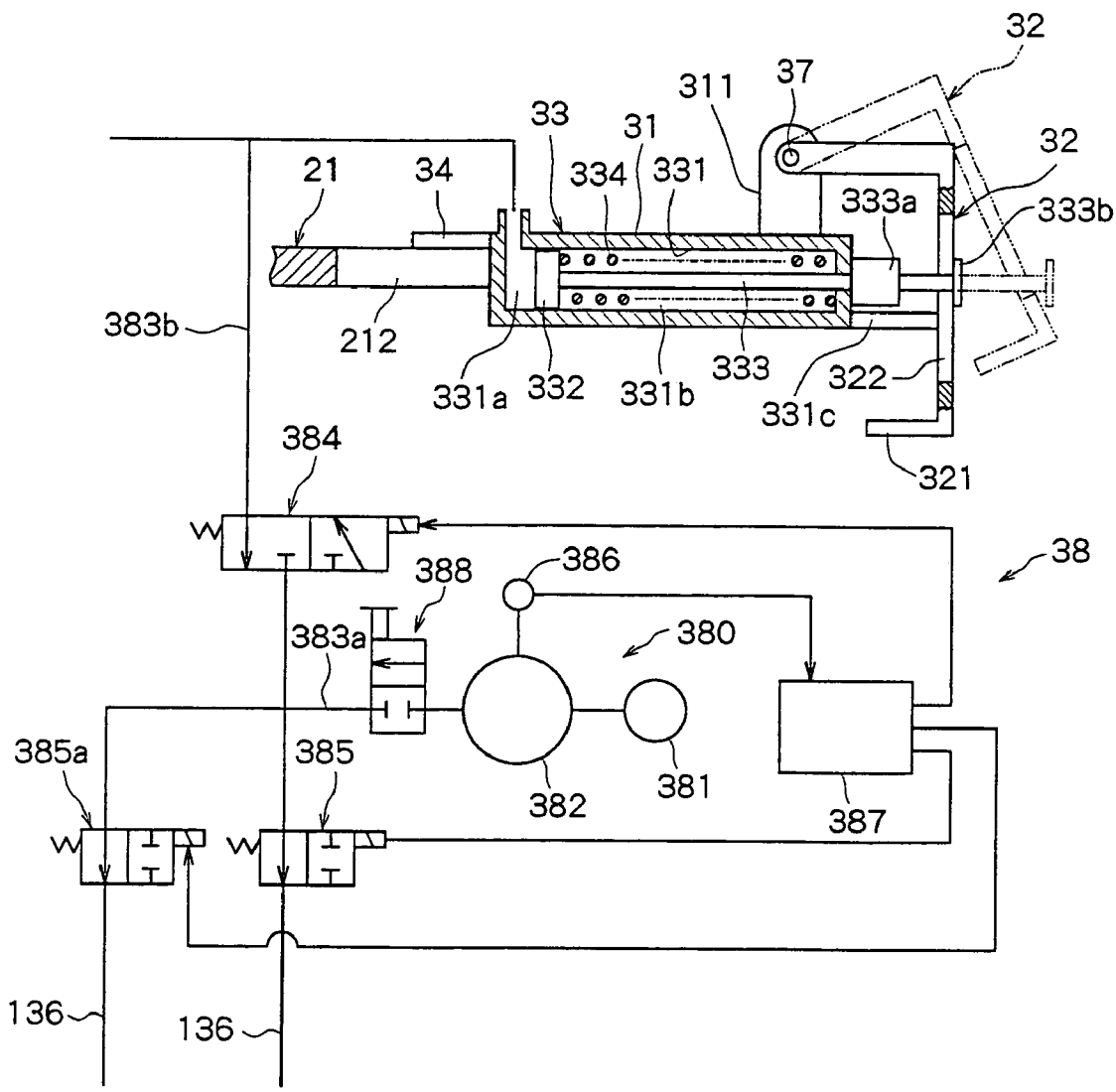
FIG. 6 is a schematic diagram showing the relationship between the falling prevention means and an air supply means that constitute the suction-holding means shown in FIG. 2.

Air is appropriately supplied into one chamber 331a formed on the left side in FIG. 6 of the piston 332 by an air supply means 38 that will be described later, and a compression coil spring 334 for urging the piston 332 to move it in a left direction in FIG. 6 is provided in the other chamber 331b formed on the right side in FIG. 6 of the piston 332. The piston 332 of the thus constituted air piston mechanism 33 is moved to a position shown in FIG. 6 by the spring force of the coil spring 334 when air is not supplied to the chamber 331a, so that the above support member 32 is situated at a holding position shown by a solid line in FIG. 6. When air is supplied into the one chamber 331a, the piston 332 moves in a right direction in FIG. 6 in defiance of the spring force of the coil spring 334 to turn the above support member 32 counterclockwise on the support shaft 37 as the center and move it to a retreat position shown by a two-dot chain line in FIG. 6. A turn restricting member 331c for restricting the turning of the support member 32 clockwise on the support shaft 37 as the center from a state shown by a solid line in FIG. 6 is disposed at the lower end portion on the support member 32 side of the above housing 31.

The above air supply means 38 has an air supply source 380 that is composed of a compressor 381 and an air tank 382 for storing compressed air ejected from the compressor 381. The air tank 382 and the one chamber 331a of the above air piston mechanism 33 are connected to each other by a pipe 383a and a flexible pipe 383b, and an electromagnetic control valve 384 is provided between the pipe 383a and the flexible pipe 383b. This electromagnetic control valve 384 is so constituted that when it is in a state of OFF, it disconnects the pipe 383a from the flexible pipe 383b to open the flexible pipe 383b to the air and connects the pipe 383a to the flexible pipe 383b when it is turned ON. The above air tank 382 and the above non-contact suction-holders 24 are connected to each other by the pipe 383a and the above flexible pipes 136, and an electromagnetic control valve 385 is provided between the pipe 383a and the flexible pipes 136. This electromagnetic control valve 385 is so constituted that when it is in a state of OFF, it connects the pipe 383a to the flexible pipes 136 and disconnects the pipe 383a from the flexible pipes 136 when it is turned ON.

The air supply means 38 in the illustrated embodiment has a pressure detection means 386 for detecting the inside air pressure of the air tank 382 and a control means 387 for controlling the above electromagnetic control valve 384 based on a detection signal from the pressure detection means 386. The control means 387 is so designed to receive a control signal for controlling the operation of the conveying device, and based on this control signal, it outputs a control signal to the above electromagnetic control valve 384, the electromagnetic control valve 385 and an electromagnetic control valve 385a which will be described later. The above pipe 383a is provided with a manual changeover switch valve 388. This manual changeover switch valve 388 is opened by an operator at the time of starting cutting work to let air pass through the pipe 383a.

The suction-holding means 20 in the illustrated embodiment is constituted as described above, and its function will be described with reference to FIG. 7.

The suction-holding means 20 is positioned above the semiconductor wafer 9 as the plate-like workpiece, the electromagnetic control valve 384 is turned on and further, the electromagnetic control valve 385 is turned off. When the electromagnetic control valve 384 is turned on, the pipe 383a communicates with the flexible pipe 383b as described above and hence, air is supplied from the air tank 382 into the one chamber 331a of the above air piston mechanism 33. As a result, the piston 332 moves in the right direction in FIG. 6 in defiance of the spring force of the coil spring 334 as described above to move the above support member 32 to the retreat position shown by the two-dot chain line. That is, the support member 32 is positioned to the retreat position shown by the two-dot chain line in FIG. 7, and the support claw 321 is positioned above outside the rubber sheet 222 of the periphery support member 22. On the other hand, when the electromagnetic control valve 385 is turned off, the pipe 383a communicates with the flexible pipes 136 as described above and hence, air is supplied to each of the above three non-contact suction-holders 24 from the air tank 382. As a result, air is ejected from the nozzles 242 of the non-contact suction-holders 24 to produce a negative pressure in the center portions of the non-contact suction-holders 24 as shown in FIG. 3. Although the semiconductor wafer 9 is adsorbed by this negative pressure as shown in FIG. 7, when the semiconductor wafer 9 approaches the non-contact suction-holders 24, air functions as repulsive force to prevent contact between the non-contact suction-holders 24 and the semiconductor wafer 9, and consequently, the semiconductor wafer is suction-held without contact. When the semiconductor wafer 9 is thus adsorbed by the three non-contact suction-holders 24, the peripheral edge of the semiconductor wafer 9 comes into contact with the rubber sheets 222 constituting the plurality of periphery support members 22 disposed to the under surface of the peripheral area of the plate-like workpiece holding member 21 to restrict the movement in the horizontal direction of the semiconductor wafer 9. Since the center portion of the semiconductor wafer 9 suction-held by the suction-holding means 20 as described above is partly adsorbed by the three non-contact suction-holders 24, it is not greatly curved or not broken even when the grooves are formed as will be described later.

A case where the compressor 381 constituting the air supply source 380 goes wrong while the semiconductor wafer 9 is suction-held and carried by the suction-holding means 20 as described above will be described hereinbelow.

As air is not supplied into the air tank 382 when the compressor 381 goes wrong, the inside air pressure of the air tank 382 drops. When the air pressure becomes a predetermined value or less, the control means 387 turns off the electromagnetic control valve 384 based on a detection signal from the pressure detection means 386. When the electromagnetic control valve 384 is turned off, the pipe 384a and the flexible pipe 383b are disconnected from each other to cut off the supply of air as described above and further, the flexible pipe 383b is opened to the atmosphere, whereby air in the one chamber 331a of the above air piston mechanism 33 is discharged into the atmosphere through the flexible pipe 383b and the electromagnetic control valve 384. As a result, the piston 332 of the air piston mechanism 33 is positioned to the holding position shown by the solid line in FIG. 6 by the spring force of the compression coil spring 334. That is, the support member 32 is moved to the holding position shown by the one-dot chain line from the retreat position shown by the two-dot chain line in FIG. 7.

Meanwhile, air is kept supplied to the non-contact suction-holders 24 until the inside air pressure of the air tank 382 becomes atmospheric pressure even when it drops. Therefore, the suction function of the non-contact suction-holders 24 is maintained for a short period of time. During this, the support members 32 of the above three falling prevention means 30 are positioned to the holding position shown by the one-dot chain line in FIG. 7. Accordingly, when the suction function of the non-contact suction-holders 24 is lost, the semiconductor wafer 9 is held by the support claws 321 of the support members 32 as shown by the one-dot chain line. Therefore, even when the compressor goes wrong while the semiconductor wafer 9 is suction-held and carried by the suction-holding means 20, the semiconductor wafer 9 does not fall.

A case where power supply is cut off while the semiconductor wafer 9 is suction-held and carried by the suction-holding means 20 as described above will be described hereinbelow.

When power supply is cut off, the compressor 381 constituting the air supply source 380 is stopped and at the same time, controlling by the control means 387 becomes impossible. Therefore, the electromagnetic control valve 384 and the electromagnetic control valve 385 become a state of OFF. As a result, the pipe 383a and the flexible pipe 383b are disconnected from each other to cut off air supply and concurrently, the flexible pipe 383b is opened to the atmosphere. Accordingly, the support member 32 is positioned to the holding position shown by the one-dot chain line from the retreat position shown by the two-dot chain line in FIG. 7 as described above.

On the other hand, since air is kept supplied to the non-contact suction-holders 24 until the pressure of air stored in the air tank 382 becomes atmospheric pressure though air is not supplied into the air tank 382 by a halt of the compressor 381, the suction function of the non-contact suction-holders 24 is maintained. As the support members 32 of the above three falling prevention means 30 are situated at the holding position shown by the one-dot chain line in FIG. 7 during this, when the suction function of the non-contact suction-holders 24 is lost, the semiconductor wafer 9 is held by the support claws 321 of the support members 32 as shown by the one-dot chain line. Accordingly, in the illustrated embodiment, even when power supply is cut off while the semiconductor 9 is suction-held and carried by the suction-holding means 20, the semiconductor wafer 9 does not fall.

Figure 8:
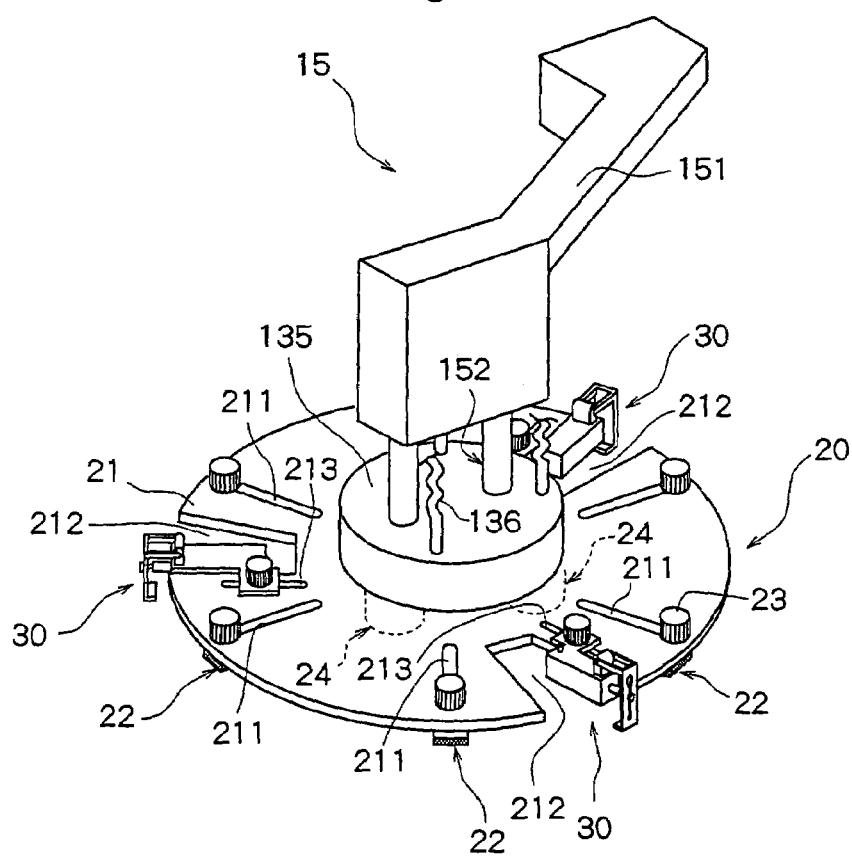
FIG. 8 is a perspective view of the suction-holding means of a second conveying device as a conveying device means constituted according to the present invention.

A description is subsequently given of the second conveying device 15 with reference to FIG. 8.

The second conveying device 15 in the illustrated embodiment has a working arm 151. This working arm 151 is, at its one end, connected to a reciprocating means (not shown) which has been used conventionally. Therefore, a suction-holding means 20 that is connected to the other end of the working arm 151 and will be described later is moved between the above cleaning means 14 and the above chuck table 3 on the horizontal plane. The suction-holding means 20 mounted to the other end of the working arm 151 is substantially identical to the suction-holding means 20 of the first conveying device 13 shown in FIGS. 2 to 7 in constitution. Therefore, the same reference symbols are given to the same members and their descriptions are omitted. A mounting member 135 attached on the top surface of a plate-like workpiece holding member 21 constituting the suction-holding means 20 is connected to a lifting means 152 disposed to the other end of the working arm 151. This lifting means 152 is composed of, for example, an air piston or the like. The suction-holding means 20 of the second conveying device 15 constituted as described above is operated by the air supply means 38 shown in FIG. 6. In the air piston mechanism 33 constituting the suction-holding means 20 of the second conveying device 15, the flexible pipes 383b are connected to the above electromagnetic control valve 384, whereas in the non-contact suction-holders 24, the flexible pipes 136 are connected to the above pipe 383a through the electromagnetic control valve 385a.

The cutting machine provided with the conveying devices for a plate-like workpiece constituted in accordance with the present invention is constituted as described above, and its function will be described with reference to FIG. 1.

To cut the semiconductor wafer 9, the cassette body 7 storing the semiconductor wafer 9 is placed on the cassette table 81 of the cassette placing means 8 in such a manner that the take-out/take-in opening 71 faces the tentative placing area side, thereby completing the preparation of cutting work. To start the cutting work, the operator opens the above manual changeover switch valve 388 to let air pass through the pipe 383a.

Figure 7:
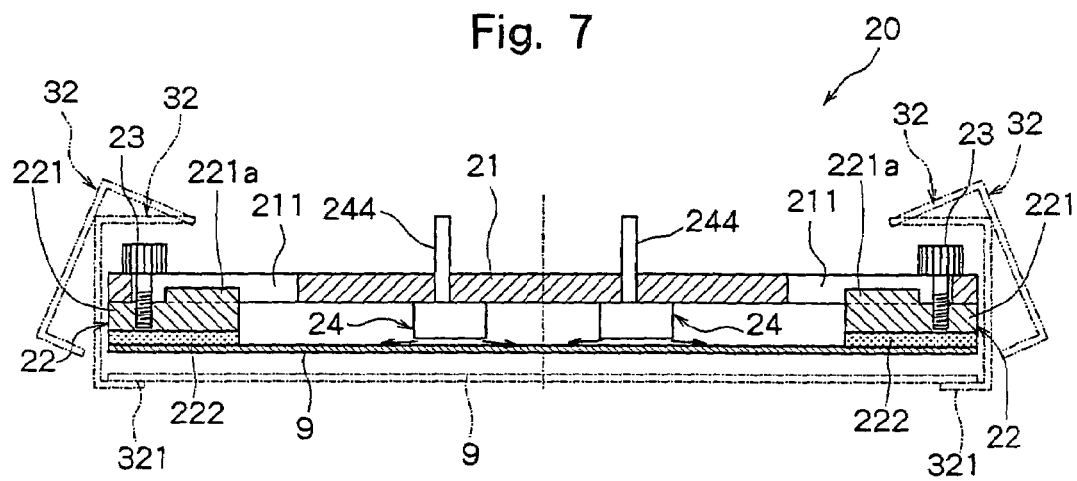
FIG. 7 is a sectional view showing that the plate-like workpiece is suction-held by the suction-holding means shown in FIG. 2.

When the start of the cutting work is instructed, the electromagnetic control valve 384 is turned on to situate the support members of the falling prevention means 30 of the first conveying device 13 and the second conveying device 15 to the retreat position shown by the two-dot chain line in FIG. 7, as described above. This state is maintained until the start instruction of the cutting work is canceled. When the start of the cutting work is instructed, the electromagnetic control valve 385 and the electromagnetic control valve 385a are turned on to cut off air supply to the non-contact suction-holders 24 of the first conveying device 13 and the second conveying device 15. The workpiece take-out means 11 carries the semiconductor wafer 9 stored at a predetermined position of the cassette body 7 to the aligning means 12 by its advance and retreat movements. The semiconductor wafer 9 carried to the aligning means 12 is aligned to the central location and then, carried to the placing surface of the adsorption chuck 3b constituting the above chuck table 3 by the first conveying device 13. That is, the lifting mean 132 and the moving means 133 (see FIG. 2) constituting the first conveying device 13 are operated to position the suction-holding means 20 above the semiconductor wafer 9 aligned by the aligning means 12 and then, the electromagnetic control valve 385 is turned off. As a result, since the support members 32 constituting the falling prevention means 30 are situated at the retreat position shown by the two-dot chain line in FIG. 7, the semiconductor wafer 9 is suction-held by the suction-holding means 20 as described above. When the suction-holding means 20 suction-holds the semiconductor wafer 9, the above lifting means 132 and the moving means 133 are operated to carry the semiconductor wafer 9 suction-held by the suction-holding means 20 to the placing surface of the adsorption chuck 3b constituting the above chuck table 3.

The suction-holding by the suction-holding means 20 constituting the first conveying device 13, of the semiconductor wafer 9 which has been carried onto the adsorption chuck 3b of the chuck table 3 by the first conveying device 13 as described above is canceled. That is, the electromagnetic control valve 385 of the above air supply means 38 is turned on. The electromagnetic control valve 384 of the air supply means 38 is kept on at this point, and the support members 32 are maintained at the retreat position shown by the two-dot chain line in FIG. 7. The semiconductor wafer 9 placed on the adsorption chuck 3b of the chuck table 3 is suction-held to the adsorption chuck 3b by a suction means that is not shown. The chuck table 3 thus suction-holding the semiconductor wafer 9 is moved right below the image pick-up means 5. When the chuck table 3 is positioned right below the image pick-up means 5, cutting lines formed on the semiconductor wafer 9 are detected by the image pick-up means 5, and the spindle unit 4 is moved in the direction shown by the arrow Y that is the indexing direction to carry out precision alignment work.

Thereafter, the chuck table 3 suction-holding the semiconductor wafer 9 is moved at a predetermined feed speed in the direction shown by the arrow X (direction perpendicular to the rotation axis of the cutting blade 43) that is the feed direction while the cutting blade 43 is turned in a predetermined direction to form grooves having a depth equal to the final thickness of the semiconductor chip along the streets in the front surface of the semiconductor wafer 9 held on the chuck table 3. That is, the cutting blade 43 is attached to the spindle unit 4 moved and adjusted in the direction shown by the arrow Y that is the indexing direction and the direction shown by the arrow Z that is the cutting direction to be positioned, and rotationally driven. Therefore, the semiconductor wafer 9 held on the chuck table 3 is cut to a predetermined cutting depth along the streets with the cutting blade 32 by moving the chuck table 3 in the feed direction along the under side of the cutting blade 43. When the grooves are formed along the streets in the front surface of the semiconductor wafer 9 as described above, the chuck table 3 holding the semiconductor wafer 9 is returned to a position where it first suction-held the semiconductor wafer 9, and here, the suction-holding of the semiconductor wafer 9 is canceled.

Thereafter, the semiconductor wafer 9, for which suction-holding has been canceled on the chuck table 3, is carried to the above cleaning means 14 by the second conveying device 15. That is, the lifting 152 and a reciprocating means (not shown) constituting the second conveying device 15 are operated to position the suction-holding means 20 above the semiconductor wafer 9 placed on the chuck table 3, and the electromagnetic control valve 385a of the above air supply means 38 is turned off. As a result, since the support members 32 constituting the falling prevention means 30 are situated at the retreat position shown by the two-dot chain line in FIG. 7, the semiconductor wafer 9 is suction-held by the suction-holding means 20 as described above. When the semiconductor wafer 9 has been thus suction-held by the suction-holding means 20, the lifting means 152 and the reciprocating means (not shown) are operated to convey the semiconductor wafer 9 suction-held by the suction-holding means 20 to the above cleaning means 14. Since the center portion of the semiconductor wafer 9 suction-held by the suction-holding means 20 is partially adsorbed by the three non-contact suction-holders 24 as described above, it is not greatly curved with the result that a great bending moment is not produced and the semiconductor wafer 9 is not broken even when the grooves have been formed in the front surface of the semiconductor wafer 9. When the semiconductor wafer 9 suction-held by the suction-holding means 20 is thus carried to the cleaning means 14, the electromagnetic control valve 385a of the above air supply means 38 is turned on, whereby the suction-holding of the semiconductor wafer 9 by the suction-holding means 20 is canceled.

Contaminants produced at the time of cutting are removed by the cleaning means 14 from the semiconductor wafer 9 carried to the cleaning means 14. The semiconductor wafer 9 cleaned by the cleaning means 14 is carried to the above aligning means 12 by the above first conveying device 13. That is, the lifting means 132 and the moving means 133 (see FIG. 2) constituting the first conveying device 13 are operated to position the suction-holding means 20 above the semiconductor wafer 9 cleaned by the cleaning means 14, and the electromagnetic control valve 385 of the above air supply means 38 is turned off. As a result, since the support members 32 constituting the falling prevention means 30 are situated at the retreat position shown by the two-dot chain line in FIG. 7, the semiconductor wafer 9 is suction-held by the suction-holding means 20 as described above. When the suction-holding means 20 suction-holds the semiconductor wafer 9, the above lifting means 132 and the moving means 133 are operated to carry the semiconductor wafer 9 suction-held by the suction-holding means 20 to the aligning means 12. Since the center portion of the semiconductor wafer 9 suction-held by the suction-holding means 20 constituting the first conveying device 13 is partly adsorbed by the three non-contact suction-holders 24 as described above, it is not greatly curved. Therefore, a large bending moment is not produced and the semiconductor wafer 9 is not broken even when the grooves have been formed in the front surface of the semiconductor wafer 9. The semiconductor wafer 9 carried to the aligning means 12 is stored at the predetermined position of the cassette 7 by the workpiece take-out means 11.

As described above, in the illustrated embodiment, the support members 32 of the falling prevention means 30 are situated at the retreat position shown by the two-dot chain line in FIG. 7 until termination of cutting work. When the compressor 381 goes wrong or power supply is cut off in a state of the semiconductor wafer 9 being held by the suction-holding means 20 of the first conveying device 13 or the second conveying device 15, the above support members 32 are caused to situate at the holding position shown by the one-dot chain line in FIG. 7 as described above. Therefore, even when the suction function of the suction-holding means 20 is lost, the semiconductor wafer 9 is held by the support members 32 and does not fall.

What is claimed is:

1. A conveying device for a plate-like workpiece, comprising a suction-holding means for suction-holding the plate-like workpiece and a moving means for moving the suction-holding means between a first predetermined position and a second predetermined position, wherein
the suction-holding means comprises a plate-like workpiece holding member, non-contact suction-holders disposed on the under surface of the center area of the plate-like workpiece holding member, a restricting means which is mounted on the under surface of the peripheral area of the plate-like workpiece holding member and restricts the movement in the horizontal direction of the plate-like workpiece, and a plurality of falling prevention means which are mounted in the peripheral area of the plate-like workpiece holding member at predetermined intervals in the circumferential direction and prevent the falling of the plate-like workpiece adsorbed by the non-contact suction-holders.

2. The conveying device for a plate-like workpiece according to claim 1, wherein each of the falling prevention means comprises a support member which can be moved to a holding position for supporting the under surface of the peripheral portion of the plate-like workpiece adsorbed by the non-contact suction-holders and to a retreat position where it retreats from the holding position outward in the radial direction of the plate-like workpiece holding member, and an air piston mechanism for operating the support member to the holding position and to the retreat position.

3. The conveying device for a plate-like workpiece according to claim 2, wherein the air piston mechanism has a spring for urging the support member toward the holding position, and when air is supplied, the support member is situated to the retreat position in defiance of the spring force of the spring, and when air supply is cut off, the support member is situated to the holding position by the spring force of the spring.

4. The conveying device for a plate-like workpiece according to claim 3, wherein air to be supplied to the air piston mechanism is supplied by an air supply means having an air supply source for supplying air to the non-contact suction-holders.

5. The conveying device for a plate-like workpiece according to claim 4, wherein the air supply means comprises an electromagnetic control valve mounted to a pipe for connecting the air tank of the air supply source with the air piston mechanism, a pressure detection means for detecting the inside air pressure of the air tank, and a control means for controlling the electromagnetic control valve in response to a detection signal from the pressure detection means, and the control means controls the electromagnetic control valve to disconnect the air piston mechanism from the air tank and release the air of the air piston mechanism when the inside air pressure of the air tank becomes a predetermined value or less.

6. The conveying device for a plate-like workpiece according to claim 1, wherein the falling prevention means is so constituted to be allowed to move for adjustment in the radial direction of the plate-like workpiece holding member.

\* \* \* \* \*